United States Patent [19]
Yamazaki et al.

[11] Patent Number: 5,449,941
[45] Date of Patent: Sep. 12, 1995

[54] SEMICONDUCTOR MEMORY DEVICE

[75] Inventors: Shunpei Yamazaki, Tokyo; Yasuhiko Takemura, Kanagawa, both of Japan

[73] Assignee: Semiconductor Energy Laboratory Co., Ltd., Kanagawa-ken, Japan

[21] Appl. No.: 966,857

[22] Filed: Oct. 27, 1992

[30] Foreign Application Priority Data

Oct. 29, 1991 [JP] Japan .................................. 3-309914

[51] Int. Cl.⁶ .................. H01L 29/68; H01L 27/02; H01L 29/34
[52] U.S. Cl. .................................. 257/411; 257/316; 257/320; 257/321; 257/635; 257/639; 257/649
[58] Field of Search .............. 257/314, 315, 316, 390, 257/411, 412, 320, 321, 327, 635, 639, 649

[56] References Cited

U.S. PATENT DOCUMENTS

| | | | |
|---|---|---|---|
| 4,623,912 | 11/1986 | Chang et al. | 357/54 |
| 4,665,608 | 5/1987 | Okamoto et al. | 29/571 |
| 5,025,494 | 6/1991 | Gill et al. | 257/316 |
| 5,045,488 | 9/1991 | Yeh | 257/316 |
| 5,060,034 | 10/1991 | Shimizu et al. | 29/68 |
| 5,065,220 | 11/1991 | Paterson et al. | 357/51 |
| 5,067,108 | 11/1991 | Jeng | 257/316 |
| 5,079,606 | 1/1992 | Yamamura et al. | 357/23.7 |
| 5,194,925 | 3/1993 | Ajika et al. | 257/314 |

FOREIGN PATENT DOCUMENTS 56-87370  7/1981  Japan .
206777  11/1992  Japan .

*Primary Examiner*—Rolf Hille
*Assistant Examiner*—Valencia M. Wallace
*Attorney, Agent, or Firm*—Sixbey, Friedman, Leedom & Ferguson; Gerald J. Ferguson, Jr.

[57] ABSTRACT

A semiconductor memory device capable of being electrically written and erased comprising a floating gate, wherein, a silicon nitride, silicon oxinitride, aluminum oxide, or silicon carbide film is incorporated between the drain region and the floating gate.

29 Claims, 6 Drawing Sheets

SEMICONDUCTOR MEMORY DEVICE

BACKGROUND OF THE INVENTION

1. Field of the Invention

The present invention relates to a MOS (metal oxide semiconductor) memory device. More particularly, it relates specifically to a so-called EPROM (electrically programmable read-only-memory), EEPROM (electrically erasable programmable read only memory), or flash memory, i.e., to a type of semiconductor memory comprising a floating gate and a control gate, in which the information is stored by the carriers that are captured in the floating gate upon applying high voltage to the control gate.

In contrast to the conventional memory devices in which the repetition of erasing and writing of information is limited to a predetermined value due to damage of gate insulator films and the like at the introduction of carriers, the present invention provides, particularly, a semiconductor device which can be subjected far more frequently to erasing and writing. The application field of the memory devices, which was confined to a certain field for the conventional devices, is now extended not only to novel fields but also to the field in which other types of memory are now utilized. Accordingly, the present invention is applicable not only to the fields in which conventional EEPROM, EPROM, etc., are used to the present, but also to various fields in which RAMs (random access memories) are used.

2. Prior Art

Many research and development efforts are now paid for realizing finer, more highly integrated, and more functional semiconductor devices. In particular, the most remarkable progress can be found in the insulated gate field-effect semiconductor devices called MOSFETs (metal oxide semiconductor field-effect transistors). The metals used herein not only refer to pure metals, but it collectively encompasses semiconductor materials having sufficiently high electric conductivity, alloys of semiconductors with metals, and the like. The oxide to be placed between the metal and the semiconductor not necessary be a pure oxide, and insulators such as nitrides are sometimes used. In this context, the term "MOS" is not applicable to such structures in a strict sense; in the descriptions hereinafter, however, devices of field effect type having the structure above, inclusive of those comprising nitrides or other insulators in the place of oxides, are referred to as MOSFETs or MOS transistors.

A typical MOS transistor comprises a semiconductor substrate having provided thereon an oxide (insulator) such as silicon oxide as a gate oxide (gate insulator), and further thereon a metal, a semiconductor, etc., which functions as a gate electrode. The conductivity of the base semiconductor is controlled by varying the voltage which is applied to the gate electrode.

Also, there is known that a nonvolatile memory can be fabricated by establishing an electrically independent semiconductor film (i.e., a floating gate) on the gate oxide, and then providing thereon a gate electrode (i.e., a control gate). Those memories are commercially available as EPROMs and EEPROMs. In the memories of this type, the conductivity of the base semiconductor is semi-permanently fixed by applying an intense electric field to the gate electrode, thereby trapping charges such as electrons and holes in the floating gate film. Thus, of course, if the charge having implanted into the floating gate is removed by using an ultraviolet (UV) irradiation or an electric effect, the initial state can be recovered and hence the stored data can be erased. A semiconductor memory device can be assembled from such floating gate type MOS transistors alone, or from a combination of those with other transistors.

The memories using the elements described above are, in contrast to the RAM devices such as DRAMs (dynamic random access memory) and SRAMs (static random access memory), operable without using a power source. Furthermore, when compared with a DRAM, in particular, the memories of the type above can be used free of capacitors. Hence, they are now the subject of active study because they can minimize the cell area per bit in fabricating a memory of 16 MB or more in size and are thereby best suited for realizing higher integration. Among them, particular attention is paid to the EEPEOMs.

It should be noted, however, that the MOSFETs having the floating gate above are different from the RAMs in one point, i.e., that the MOSFETs of this type cannot be subjected to writing and erasing processes for an infinite times. Thus, EOM devices are put into one category separately from the RAMs. It is guaranteed for a commercially available EEPROM to endure writing and erasing data for 10,000 to 100,000 times. If such a memory device were to be assembled into a computer as a temporal data memory in the place of a conventionally employed RAM, it must be guaranteed to endure for at least 100,000 times, and preferably 1,000,000 times of repeated writing and erasing processes.

The conventional types of EEPEOMs can resist only to limited times of writing and erasing, because the gate oxide film under the floating gate suffers serious damage upon implanting carriers into or drawing them out from the floating gate. More specifically, the interatomic bonds inside the insulator layer (a silicon oxide film, in general) are cut by the high energy carriers passing therethrough to form defects such as trap levels. Once such defects are formed, the carriers easily move through the insulator layer and allow the charge having accumulated in the floating gate to escape. If such a phenomenon occurs, the EEPROM no longer functions as a memory device, or its reliability is almost lost.

It is preferred to use a material having a strong interatomic bond for the insulator layer to cope with the aforementioned problems. For example, silicon nitride and aluminum oxide can be suitably used as the insulator layer. However, those insulating materials, on the other hand, develop poor interfacial states with a semiconductor (silicon) substrate; i.e., the development of a trap level disturbs electric conductivity in the channel region of the MOS or lowers the mobility of the carriers.

The EEPROM is believed promising for use as a flash memory, i.e., a special type of a nonvolatile memory to replace DRAMs, but the market is yet to be matured due to the limits concerning the repetition of writing.

SUMMARY OF THE INVENTION

In the light of the aforementioned circumstances in which no EPROMs and EEPROMs endurable to a desired repetition of writing and erasing data are available, the present invention provides a floating gate structure guaranteed for a durability to 100,000 times or more, preferably, 1,000,000 times or more of writing and erasing.

Accordingly, the semiconductor memory device of the present invention makes the best of, as mentioned hereinbefore, the nature of silicon nitride, silicon oxinitride, silicon carbide or aluminum oxide. That is, the problems enumerated above are solved by taking advantage of their characteristic strong interatomic bonding and their low vulnerability upon the electron transfer which generally form defects.

However, it is not favorable to form those insulating materials directly on the channel-forming region because such insulators not only impair stability in the conductivity of the channel, but also lower the mobility of the carriers. Thus, in the present invention, the use of those insulator materials is confined only on the path through which the charge moves to the floating gate. It is preferred that a silicon oxide film is provided on the channel-forming region.

DETAILED DESCRIPTION OF THE INVENTION

Figure 1A:
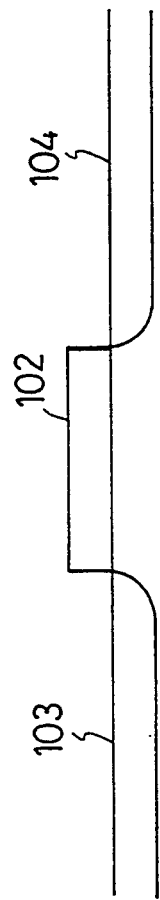
FIGS. 1A–1D show schematically a structure of an EEPROM device according to the present invention, together with the scheme of its fabrication process.

Referring to FIG. 2, the process for fabricating a memory cell for a conventional EEPROM is described. An EEPROM is fabricated by first selectively establishing, using a mask material such as a photoresist, a source region 203 and a drain region 204 on a semiconductor substrate 201 as shown in FIG. 2(A). Then, a thin silicon oxide film 205 is uniformly provided thereon by applying, for example, thermal oxidation. This thin silicon oxide film comprises a hole 206 in the drain, however, as shown in FIG. 2(B).

Figure 2A:
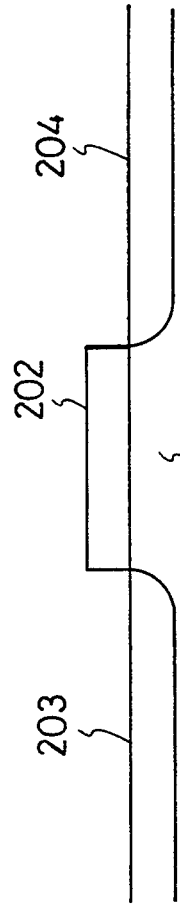
FIGS. 2A–2D show schematically a structure of a conventional EEPROM device together with the scheme of its fabrication process.
Figure 2B:
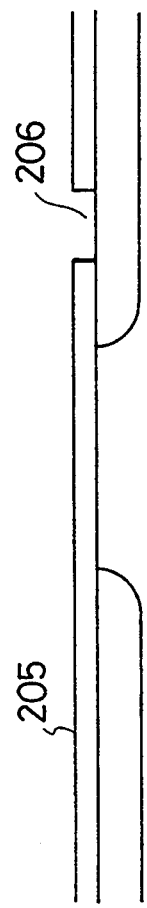
Figure 2C:
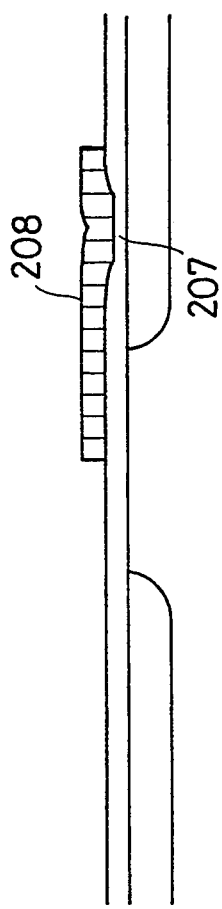

Subsequently, another silicon oxide film is formed to cover the hole 206 above. The hole 206 is thus covered with a film thinner than the other parts. Then, a floating gate 208 is established by coating a part of the drain and a part of the channel region with a material such as polycrystalline silicon. In this manner a structure as shown in FIG. 2(C) can be obtained.

Figure 2D:
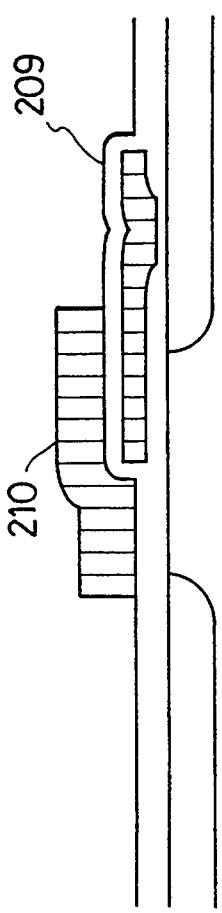

A silicon oxide film 209 is formed again thereafter, followed by the formation of a control gate 210 which partly or wholly covers the floating gate. Thus is obtained the structure as shown in FIG. 2(D). These are the essential steps for establishing the basic element structure for an EEPROM. Four masks were used through the process; one for forming the photoresist 202, another for providing the hole 206, another for establishing the floating gate 208, and the last one for providing the control gate 210. If necessary, electrodes may be optionally established thereafter on the source and drain regions.

Once this structure is established, charges can be implanted into the floating gate through the thin portion 207 of the gate insulator film upon application of a high voltage to the control gate. In the conventional EEPROM and the like, however, the interatomic bonding in the silicon oxide film is frequently destroyed by the charges moving about, leading to the formation of trap levels. Then, the charge having stored in the floating gate would flow away through the trap level.

As a means to cope with the aforementioned problems, the memory according to the present invention comprises a material having a strong interatomic bonding, such as silicon nitride and aluminum oxide and silicon oxinitride $(SiO_xN_y(0<X<2, 0<Y<4))$ and silicon carbide $(Si_xC_{1-x}(0<X\leq 1))$, between the floating gate and the drain region selectively at portions where thin insulator films are used. Oxygen of the silicon oxinitride film is preferably 30 atom % or less of nitrogen of the silicon oxinitride film. A typical example of such a structure is shown in FIG. 1.

A memory device capable of being electrically written and erased according to the present invention can be fabricated by a process as follows. First, as shown in FIG. 1(A), a mask material 102 such as a photoresist is formed on selective portions of a semiconductor substrate 101 to selectively establish a source region 103 and a drain region 104 on the semiconductor substrate with a channel region provided between the drain region and the source region.

Figure 1B:

A thin coating 105 of silicon nitride or of aluminum oxide or of silicon oxinitride or of silicon carbide is formed selectively on a part of the drain. The thickness of the thin coating 105 is preferably in the range of from 2 to 100 nm in case of silicon nitride and aluminum oxide and in the range of from 10 to 200 Å (more preferably 20 to 5.0 Å) in case of silicon oxinitride and silicon carbide so that a current (F-N current) flow may occur therethrough by the Fowler-Nordheim effect. Particularly in the case of forming a silicon nitride film, a thermal nitriding process is best suited for establishing a silicon nitride film of a uniform thickness in the preferred thickness range specified above. Thus a structure comprising an insulator 105 as shown in FIG. 1(B) can be obtained.

Figure 1C:
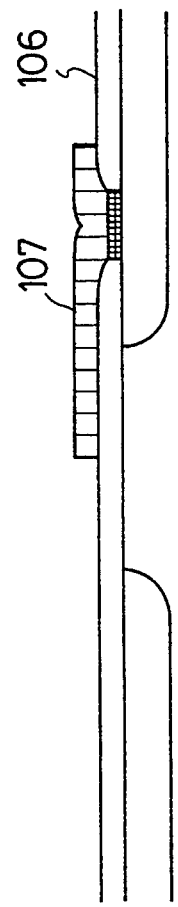

The surface of the substrate is then thermally oxidized to cover the surface with a silicon oxide film (insulator) 106 as a gate oxide film. The silicon oxide film (insulator) 106 is provided at least on the channel region. However, the thickness of the insulator 105 remains the same because no thermally oxidized film grows thereon. The silicon oxide film (insulator) 106 must be thicker than the insulator film 105, and its thickness is preferably in the range of from 10 to 50 nm. The silicon oxide film 106 is provided in contact with the channel region. A floating gate 107 is then established thereon as shown in FIG. 1(C).

A structure is thus finished into an EEPROM device by providing a control gate 109 on the silicon oxide film (insulator) 106 after forming a silicon oxide film (insulator) 108 between the floating gate and the control gate in the same manner as in a conventional process.

The structure thus obtained is also applicable to an element having a so-called vertical channel structure, i.e., such having the MOS channel being established along a direction vertical to the substrate. For details on the application of the structure described above to a vertical channel structured EEPROM and the like, reference may be made to a patent application "SEMICONDUCTOR DEVICE AND PROCESS FOR FABRICATING THE SAME" filed Oct. 8, 1991 by Handotai Energy Kenkyu-sho KK (Semiconductor Energy Laboratory Co., Ltd.). The EEPROMs of this type enables higher integration as compared with the conventional planar structured types. Furthermore, the process for their fabrication is simple, and it can be carried out with reduced number of masks.

In FIG. 3 is illustrated a process for fabricating a vertical-channel structured EEPROM device by applying the process of the present invention. A semiconductor substrate 301 (the bottom plane of the substrate is omitted in the figure) comprising thereon a surface region 302 containing an impurity dopant at a high concentration is selectively covered with a mask material 303 such as a photoresist, and then etched to a predetermined depth. The etching is then stopped before the portion having no mask material 303 thereon is so deeply etched that the etching front would reach the region undoped with the impurity. The whole structure is then covered with an insulator film 304 of silicon nitride or aluminum oxide or silicon oxinitride or silicon carbide. The required thickness is the same as that specified in the process described hereinbefore. In this manner the structure shown in FIG. 3(A) is obtained.

The etching is again taken up until a predetermined etching depth is attained. This step leaves out a protrusion (protruded portion) provided on the semiconductor substrate and containing the drain region therein as shown in FIG. 3(B), having on its side an insulator 305 which is a remainder part of the insulator coating 304.

Upon thermal oxidation of the surface of the substrate, a silicon oxide film (insulator) 306 is formed on the portion uncovered with the insulator 305. This silicon oxide film also must be provided at a thickness as specified hereinbefore. The structure is shown in FIG. 3(C).

The same fabrication steps as those used in the conventional process for vertical channel structured EEPROM can be applied then to the structure thus obtained. More specifically, a polycrystalline silicon film 307 is uniformly deposited on the whole structure as shown in FIG. 3(D), followed by direction-oriented etching to establish a portion 308 which corresponds to the floating gate on the side of the protrusion. In this manner a structure as shown in FIG. 3(E) can be obtained.

Figure 3A:
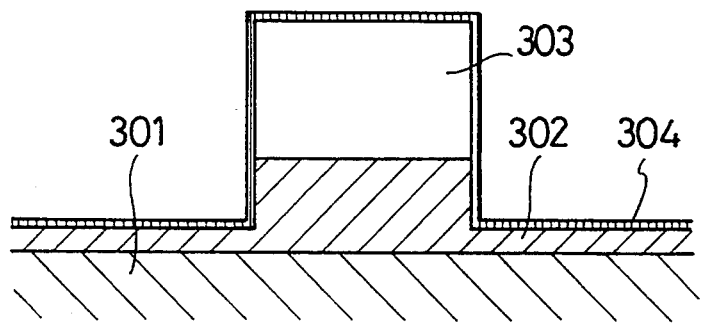
FIGS. 3A–3G schematically a structure of an EEPROM element according to the present invention, together with the scheme of its fabrication process.
Figure 3B:
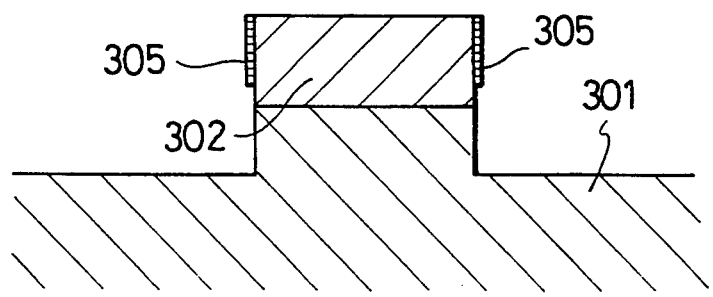
Figure 3C:
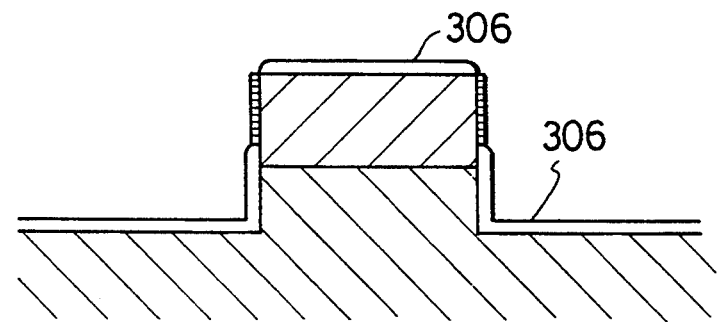
Figure 3D:
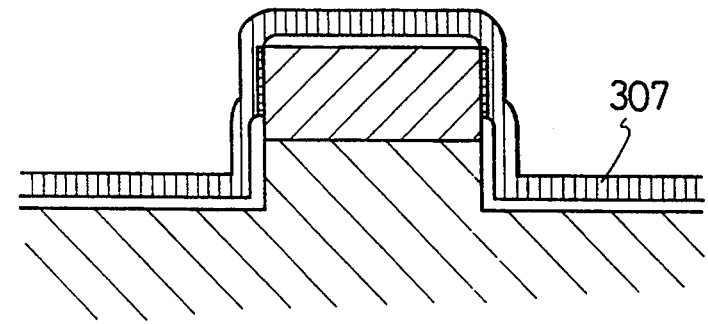
Figure 3E:
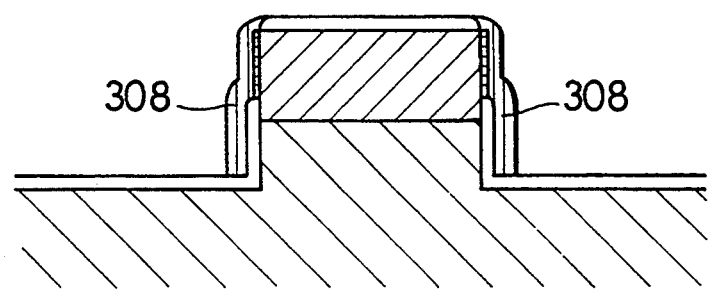
Figure 3F:
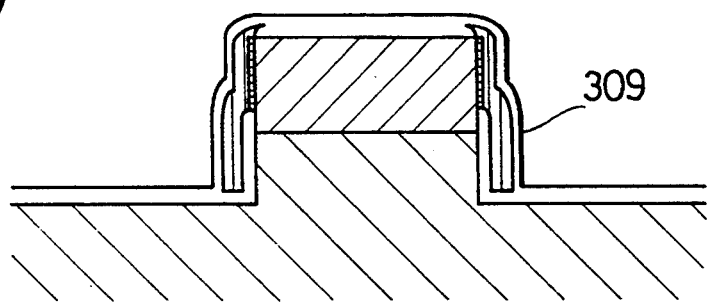
Figure 3G:
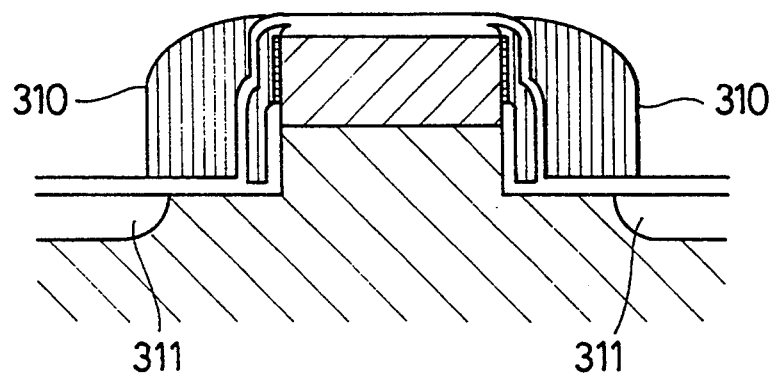

Then, a silicon oxide film (insulator) 309 is formed on the structure above by a process such as thermal oxidation, and the resulting structure as shown in FIG. 3(F) is further wholly covered with polycrystalline silicon or a coating of a pertinent conductive material. Again, the structure is subjected to direction-oriented etching to leave out a portion 310 for the control gate on the side of the protrusion. This portion 310 is then used as a mask to carry out impurity diffusion in a self-aligned process to establish a source region 311 in the semiconductor substrate. In this manner, a structure as shown in FIG. 3(G) can be obtained. It can be seen that two EEPROMs are formed in the structure shown in FIG. 3. The channel region is provided in the semiconductor substrate between the source region and the drain region in each EEPROM. The silicon oxide film (insulator) 306 is provided on the source region and the channel region in each EEPROM. The control gate 310 is provided on a side of the protrusion with the floating gate 308 between the control gate and the protrusion in each EEPROM. The silicon oxide film (insulator) 309 is provided between the control gate and the floating gate in each EEPROM.

As described in the foregoing, the structures according to the present invention comprise the insulators such as silicon nitride and silicon oxinitride and silicon carbide and aluminum oxide not in direct contact with the channel-forming regions of the MOS. For example, the insulator 105 in FIG. 1 and the insulator 305 in FIG. 3 both can be found only on the drains. That is, the insulators are indifferent to the operation of the MOSFET.

It is another advantage of the present invention that the process can be carried out without increasing the number of masks. In the process illustrated in FIG. 1, a masking step is necessary to establish the insulator 105. This step corresponds to a step in which holes (206 in FIG. 2) are bore on the insulator film in a conventional process for fabricating an EEPROM. Accordingly, the number of mask processes as a whole is equal for both the conventional process and the process according to the present invention. The required precision in the process according to the present invention also is the same as that in a conventional process.

In the process for fabricating a vertical channel EEPROM as shown in FIG. 3, no mask step for establishing an insulator 305 is necessary. This signifies that no loss of yield would occur by the use of the present invention.

The present invention is described in further detail below referring to some non-limiting examples below.

EXAMPLE 1

Referring to FIG. 1, a process according to the present invention is described. The process was applied to the fabrication of a conventional planar EEPROM device. First, though not shown in the figure, separate regions for establishing the devices were defined by a known LOCOS process on a p-type silicon wafer 101 containing impurities at a concentration of about $10^{15}$ cm$^{-3}$. After coating the resulting wafer with about 1 $\mu$m thick photoresist, a mask 102 was patterned by photolithography. The width of the mask determines the channel length of the FETs which are formed thereafter. Accordingly, the width was set at, for example, 2 $\mu$m. Then, a source region 103 and a drain region 104 were formed by implanting arsenic ions selectively into the surface of the resulting structure by a known ion implantation process. The impurity concentration should be in the range of from $0.1 \times 10^{20}$ to $5.0 \times 10^{20}$ cm$^{-3}$, and was selected as, for example, $1.2 \times 10^{20}$ cm$^{-3}$.

The mask 102 of the photoresist was then removed to expose a clean surface of the silicon wafer, and a silicon nitride film was formed thereon by thermal nitriding at a thickness in the range of from 2 to 100 nm, for example, at a thickness of 5 nm. The thermal nitriding was carried out in a reactive furnace by heating the substrate in the temperature range of from 600° to 850° C., specifically e.g., at 725° C., for 2 hours, while flowing ammonia (NH$_3$) gas at a rate of 1 l/minute.

The silicon nitride film thus established was etched to leave out a silicon nitride 105 solely on the drain region. Thus was obtained a structure as illustrated in FIG. 1(B).

The resulting structure was then subjected to thermal oxidation to form a silicon oxide film on the substrate surface at a thickness of from 20 to 100 nm, for example, at a thickness of 70 nm. In this step, the portion covered with the silicon nitride film 105 was left unoxidized.

A polycrystalline silicon film containing phosphorus at a concentration of $2\times 10^{20}$ cm$^{-3}$ was deposited on the substrate by low pressure CVD to a thickness of 50 nm. This film was then removed selectively to establish a floating gate made of polycrystalline silicon. In this manner the structure shown in FIG. 1(C) can be obtained.

Then, once again, a thermal oxidation process was carried out to form a silicon oxide film 108. The thickness of the silicon oxide film obtained as a result should be, though varying depending on whether it is deposited on the surface of the substrate or on the floating gate, for example, 50 nm on the floating gate.

Figure 1D:
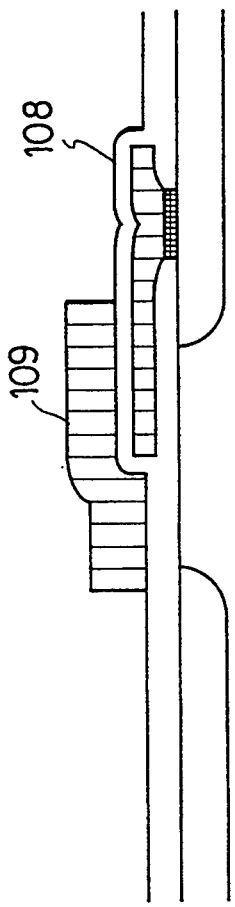

Then once again, a polysilicon film containing phosphorus as the dopant was deposited at a thickness of about 300 nm, followed by etching to establish a control gate 109 as shown in FIG. 1(D). Then, the electrodes necessary in the source and the drain regions were formed. Otherwise, if the source and the drain regions were to be used as wirings, no particular wiring using metal wires and the like is necessary. In this manner an EEPROM device can be obtained.

Figure 4:
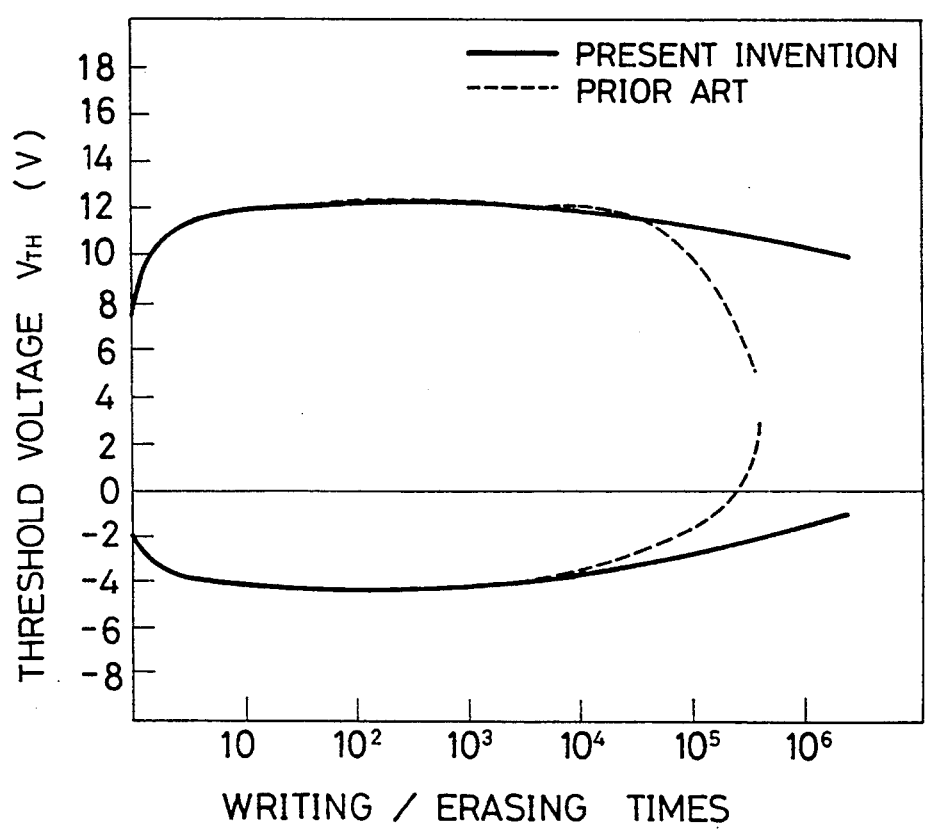
FIG. 4 is a graph showing the characteristic curves for an EEPROM element according to the present invention and for a conventional one.

The EEPROM device fabricated above was subjected to a test to see how the threshold voltage changes with varying writing/erasing times. The result was compared with another EEPROM device having fabricated by a conventional process as shown in FIG. 2. The results are given in FIG. 4. The figure clearly reads that the device having fabricated by a process according to the present invention resists far longer to repeated writing/erasing process.

Figure 5:
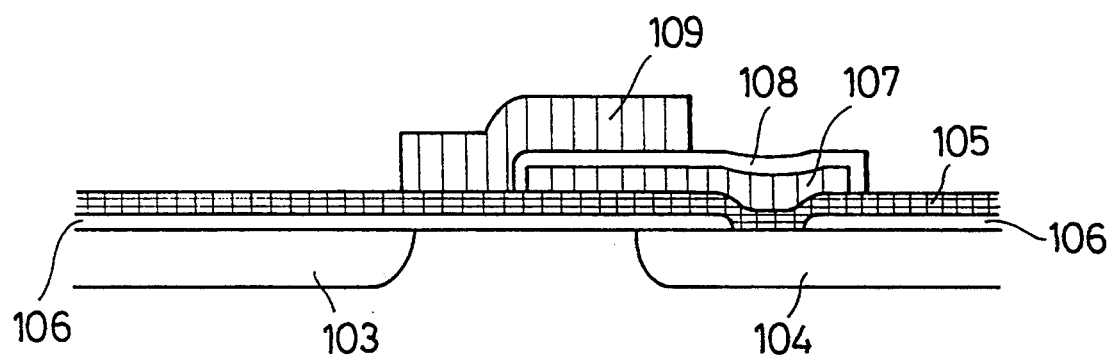
FIG. 5 shows schematically a structure of an EEPROM device according to the present invention.

Referring next to FIG. 5, an EEPROM improved as compared with EXAMPLE 1 is described. In FIG. 5, a reference numeral 103 designates a source region in a silicon wafer, 104 designates a drain region in the silicon wafer, 106 designates a silicon oxide film, 105 designates a silicon oxinitride film (SiO$_X$N$_Y$($0<X<2$, $0<Y<4$)), 107 designates a floating gate made of polycrystalline silicon containing phosphorus at a concentration of $2\times 10^{20}$ cm$^{-3}$ therein, 108 designates a silicon oxide film, and 109 designates a control gate made of a phosphorus doped polycrystalline silicon. It is preferred that a multi-layer of the silicon oxide film 106 and the silicon oxinitride film 105 is provided on the silicon wafer and a single layer of the silicon oxinitride film 105 is provided only on the path through which the charges move to the floating gate as shown in FIG. 5. The charges move through the single layer part as occasion demands, however, few defects are produced in the single layer of the silicon oxinitride film. Furthermore, since the silicon oxide film 106 is provided in contact with the channel forming region, stability in the conductivity of the channel is not impaired.

EXAMPLE 2

Referring to FIG. 3, a process according to the present invention is described. The process was applied to the fabrication of a vertical channel EEPROM device. First, an n-conductive type region 302 containing an impurity at a concentration of from $0.1\times 10^{20}$ to $2.0\times 10^{20}$ cm$^{-3}$ was established on a p-type silicon wafer 301 containing an impurity at a concentration of about $10^{15}$ cm$^{-3}$. The depth of the n-conductive region should be in the range of from 0.1 to 5.0 μm, and, for example, it was selected to be 1.5 μm. The impurity can be diffused by using any of the known diffusion processes. After coating the resulting wafer with about 5 μm thick photoresist, a specified portion 303 was patterned by photolithography. At this state, the substrate was vertically etched by using a known direction-oriented etching technology (such as biased reactive ion etching process) to establish a protrusion (protruded portion). The etching was temporarily stopped before reaching the bottom of the impurity region; the etching was stopped midway, for example, at 80% (about 1.2 μm) of the total depth of the impurity region.

Then, a silicon nitride film 304 was formed by plasma CVD or photochemical vapor deposition at a thickness of from 2 to 10 nm, specifically, for example, at a thickness of 5 nm, to obtain a structure as shown in FIG. 3(A). It is not favorable to use thermal CVD or hot nitriding in this case because such processes damage the photoresist 303.

The etching was taken up thereafter to continue etching to a predetermined depth. The substrate may be etched, for example, to a depth of about 2.5 μm from the initial surface of the substrate. In this manner, the former silicon nitride film was left over as silicon nitride portion 305 at the side of the impurity region 302. The resulting structure is shown in FIG. 3(B).

The resulting structure was then subjected to thermal oxidation to form a silicon oxide film 306 at a thickness of about 20 nm. In this step, as shown in FIG. 3(C), the portion covered with the silicon nitride film 305 is left unoxidized.

A polycrystalline silicon film 307 was then deposited on the substrate as shown in FIG. 3(D) to a thickness of 50 nm. This film was then subjected to direction-oriented etching to selectively leave a polycrystalline silicon as a floating gate 308 on the side of the protrusion (protruded portion). In this manner the structure shown in FIG. 3(E) can be obtained.

Then again, a thermal oxidation process is carried out to form a silicon oxide film 309 at a pertinent thickness as shown in FIG, 3(F). Then, once again, a 300 nm thick polycrystalline silicon film was deposited over the whole structure, followed by direction-oriented etching to establish a control gate 310. A source region 311 is then established by doping impurities to the substrate using the control gate as the mask. In this manner an EEPROM device can be obtained. In this process, one mask in total was used.

The EEPROM device fabricated above was subjected to a test of repeated writing/erasing for 2,000,000 times. It was found through this test that a difference in threshold voltage of 5 V or less between the state having a charge in the floating gate and that having no charge in the floating gate occurred only 5% of the MOS transistors thus fabricated. For reference, an EEPROM device having the same structure as that above except for omitting the silicon nitride film was fabricated, and the device thus obtained was subjected to the same test as above. As a result, it was found that 60% of the device had their difference in threshold voltage dropped to 5 V or lower. It can be seen that the present invention is effective in improving the writing/erasing properties.

As described in the foregoing, the present invention provides a charge-storage type non-volatile MOS memory device considerably increased in the repetition times of writing and erasing. The product yield of the present process is well comparable to that of a conventional one. In particular, no device degradation is observed even after repeated writing and erasing of 1,000,000 times or even more. This signifies, practically speaking, that in the case of rewriting the memory thus obtained once per 1 minute, it can be used for 1,000 hours or even longer if it can be subjected to rewriting for 1,000,000 times. Hence, the MOS memory device according to the present invention can be used as an alternative for the conventional RAM as temporal memories of computers.

While the invention has been described in detail and with reference to specific embodiments thereof, it will be apparent to one skilled in the art that various changes and modifications can be made therein without departing from the spirit and scope thereof.

What is claimed is:

1. A semiconductor memory device capable of being electrically written and erased comprising:
   a floating gate;
   a drain region; and
   a film provided between said floating gate and said drain region and comprising a material selected from the group consisting of, aluminum oxide and silicon carbide.

2. The device of claim 1 further comprising:
   a source region;
   a channel region provided between said drain region and said source region;
   an insulator provided at least on said channel region, said insulator having a thickness larger than said film; and
   a control gate provided on said insulator.

3. The device of claim 2 wherein said film is not provided on said channel region.

4. The device of claim 2 wherein said insulator comprises silicon oxide.

5. The device of claim 1 further comprising:
   a source region provided in a semiconductor substrate;
   a protrusion provided on said semiconductor substrate and containing said drain region therein;
   a channel region provided in said semiconductor substrate between said source region and said drain region;
   an insulator provided on said source region and said channel region; and
   a control gate provided on a side of said protrusion with said floating gate between said control gate and said protrusion.

6. The device of claim 5 wherein said insulator comprises silicon oxide.

7. The device of claim 6 further comprising an insulator provided between said control gate and said floating gate.

8. The device of claim 2 wherein said film comprises silicon oxinitride and is provided on said channel region with a silicon oxide between said film and said channel region.

9. The device of claim 1 wherein said silicon carbide is $Si_XC_{1-X}$ ($0<X\leq 1$).

10. A semiconductor memory device capable of being electrically written and erased comprising:
    source and drain regions;
    a channel region provided between said source and drain regions;
    a silicon oxide film provided in contact with said channel region;
    a floating gate;
    a film provided between said floating gate and said drain region and comprising a material selected from the group consisting of silicon nitride, silicon oxinitride, aluminum oxide and silicon carbide; and
    a control gate provided on said floating gate.

11. The device of claim 10 wherein said silicon oxide film has a thickness larger than said film provided between said floating gate and said drain region.

12. The device of claim 10 wherein said film provided between said floating gate and said drain region is not provided on said channel region.

13. The device of claim 10 further comprising a control gate provided on said silicon oxide film.

14. The device of claim 10 wherein oxygen of said silicon oxinitride is 30 atom % or less of nitrogen of said silicon oxinitride.

15. The device of claim 10 further comprising:
    a semiconductor substrate containing said source region therein;
    a protrusion provided on said semiconductor substrate and containing said drain region therein; and
    a control gate provided on a side of said protrusion with said floating gate between said control gate and said protrusion.

16. The device of claim 15 further comprising an insulator provided between said control gate and said floating gate.

17. The device of claim 10 wherein said silicon carbide is $Si_XC_{1-X}$ ($0<X\leq 1$).

18. A semiconductor memory device capable of being electrically written and erased comprising:
    a floating gate;
    a drain region; and
    a film provided between said floating gate and said drain region and comprising aluminum oxide,
    wherein thickness of said film is in the range of from 2 to 100 nm.

19. A semiconductor memory device capable of being electrically written and erased comprising:
    a floating gate;
    a drain region; and
    a film provided between said floating gate and said drain region and comprising silicon carbide,
    wherein thickness of said film is in the range of from 10 to 200 Å.

20. A semiconductor memory device comprising:
    a channel semiconductor layer;
    source and drain semiconductor layers with said channel semiconductor layer therebetween;
    a first insulating layer comprising an insulating oxide formed on said channel semiconductor layer;
    a control gate electrode formed over said channel semiconductor layer with said oxide insulating layer therebetween;
    an electrically floating gate located over said drain semiconductor layer; and
    a second insulating layer disposed between said floating gate and said drain semiconductor layer where an electrical charge is capable of being injected to said floating gate from said drain semiconductor layer through said second insulating layer,
    wherein said second insulating layer comprises a material selected from the group consisting of silicon nitride, silicon oxinitride, aluminum oxide and silicon carbide.

21. The semiconductor memory device of claim 20 wherein said first insulating layer directly contacts a surface of said channel semiconductor layer.

22. The device of claim 10 wherein said silicon oxinitride is $SiO_xN_y$ where $0<x<2$ and $0<y<4$.

23. A semiconductor memory device capable of being electrically written and erased comprising:

a floating gate;

a drain region; and a film provided between said floating gate and said drain region and comprising a material selected from the group consisting of silicon nitride, silicon oxinitride, aluminum oxide and silicon carbide, wherein oxygen content of said silicon oxinitride is 30 atom % or less of nitrogen content of said silicon oxinitride.

24. A semiconductor memory device capable of being electrically written and erased comprising:

a semiconductor substrate comprising a protrusion;

a nitride film provided on a portion of a side wall of said protrusion;

an oxide film provided on another portion of said side wall; and a floating gate provided on said side wall with said nitride film and said oxide film being provided between said floating gate and said protrusion.

25. The device of claim 24 wherein said nitride film comprises silicon nitride.

26. A semiconductor memory device capable of being electrically written and erased comprising:

a semiconductor substrate comprising a protrusion;

a source region provided in said semiconductor substrate;

a drain region provided in said protrusion;

a channel region provided between said source region and said drain region;

a silicon oxide film provided in contact with said channel region;

a floating gate;

a control gate provided on a side of said protrusion with said floating gate between said control gate and said protrusion; and a film provided between said floating gate and said drain region and comprising a material selected from the group consisting of silicon nitride, silicon oxinitride, aluminum oxide and silicon carbide.

27. The device of claim 20 wherein said silicon oxinitride is $SiO_xN_y$ where $0<x<2$ and $0<y<4$.

28. The device of claim 23, wherein said silicon oxinitride is $SiO_xN_y$ where $0<x<2$ and $0<y<4$.

29. The device of claim 26 wherein said silicon oxinitride is $SiO_xN_y$ where $0<x<2$ and $0<y<4$.

* * * * *